United States Patent [19]

Bhattacharyya et al.

[11] Patent Number: 4,648,179
[45] Date of Patent: Mar. 10, 1987

[54] PROCESS OF MAKING INTERCONNECTION STRUCTURE FOR SEMICONDUCTOR DEVICE

[75] Inventors: Arup Bhattacharyya, Essex Junction, Vt.; Chung Wen Ho, Chappaqua, N.Y.

[73] Assignee: International Business Machines Corporation, Armonk, N.Y.

[21] Appl. No.: 509,513

[22] Filed: Jun. 30, 1983

[51] Int. Cl.$^4$ ............................................... H05K 3/30
[52] U.S. Cl. ..................................... 29/832; 174/68.5
[58] Field of Search ................... 29/825, 830, 840, 832; 174/68.5; 361/414; 928/901

[56] References Cited

U.S. PATENT DOCUMENTS

| | | | |
|---|---|---|---|
| 3,264,402 | 8/1966 | Shaheen et al. | 29/739 X |
| 3,464,855 | 9/1969 | Shaheen et al. | 174/68.5 |
| 4,445,952 | 5/1984 | Reynold, III et al. | 174/68.5 X |
| 4,449,769 | 5/1984 | Kobayashi et al. | 29/832 X |
| 4,496,793 | 1/1985 | Hanson et al. | 29/830 X |

OTHER PUBLICATIONS

Adhesives Age, Jan., 1979, p. 35 by St. Clair et al.

Primary Examiner—Howard N. Goldberg
Assistant Examiner—Carl J. Arbes
Attorney, Agent, or Firm—Sughrue, Mion, Zinn, Macpeak and Seas

[57] ABSTRACT

A first level interconnection structure is fabricated by forming conductor patterns on the top surface of a thin flexible polymer film temporarily supported on a rigid thin ceramic or metal support member having windows therein. Via openings in the bottom surface of the polymer film are made to selected conductors, and the openings are filled with bonding metallurgy. The lower surface of the film is coated with a partially cured polyimide adhesive. The adhesive is removed in the via areas to expose the bonding metallurgy. This first layer structure is tested and then transferred to the ceramic substrate of a VSLI circuit interconnection module on which corresponding metal pads are formed for pad-to-pad contact. When pressure and heat are applied, there occurs simultaneous bonding of the metal pads on the substrate and of the film directly to the substrate. A second level interconnection structure is formed in the same manner and bonded to the top surface of the first level structure. Additional level structures may be similarily superimposed to form a multilayer interconnection structure. During bonding, the lamination of the layers occurs in such a way that a single solid film is formed with the conductors embedded therein. One or more integrated circuit chips may then be bonded by their contact pads to the conductors on the upper most level interconnection structure.

10 Claims, 6 Drawing Figures

PROCESS OF MAKING INTERCONNECTION STRUCTURE FOR SEMICONDUCTOR DEVICE

DESCRIPTION

1. Technical Field

This invention relates to the field of packaging for semiconductor chips carrying large scale integrated (LSI) or very large scale integrated (VLSI) circuits and, more particularly, to an electrical interconnection structure, and an improved process for fabricating the same, which can be used for forming a multi-layer interconnection structure which is bonded to a ceramic substrate for forming a chip module to which a chip or chips may be attached.

2. Prior Art

It is already known to manufacture layers of multi-layer ceramic circuit boards by simultaneously firing the ceramic material and the metal-filled vias. Both the ceramic and the metal in the boards contribute to the mechanical integrity of the resulting package.

Furthermore, U.S. Pat. No. 3,780,352, particularly FIG. 6 thereof, shows a multi-level electrical interconnection structure or package attached to a semiconductor device or chip which in turn is bonded to a ceramic disc. Each level consists of conductors formed on a surface of a thin flexible insulating sheet which serves both as a dielectric and as a support for the conductors. However, the insulating sheets must be self-supporting and are, therefore, relatively thick (several mils). Also, the insulating sheets are not directly bonded to each other, but rather are spaced apart, thereby forming a package which has unnecessarily large dimensions. The structure, therefore, does not provide the high interconnection density needed for semiconductor VLSI devices, and the electrical properties of the conductors are not well controlled for high speed pulse propagations. In addition, the only mechanical support is provided by relatively large and thick masses of solder in vias which interconnect conductors in the layers.

U.S. Pat. No. 3,781,596 discloses a single layer interconnection structure consisting of metallic conductors on a polyimide film, such as Du Pont "Kapton" polyimide film, whose thickness is in the range of 0.5 to 3 mils; however, there is no multi-layer structure disclosed, and, again, the only mechanical support for the film is provided by a metal-to-metal bond between the conductors on the film and a conductor on a ceramic substrate.

U.S. Pat. No. 3,832,769, particularly in FIG. 6, shows a multi-layer interconnection package or structure, wherein each layer consists of a thin flexible dielectric film of polyimide on whose surface is printed a conductive pattern. Typically, the film is 0.1 to 10 mils in thickness. However, again, in order to fabricate the multi-layer structure, the layers must be self-supporting and, thus, form a package of unnecessarily large dimensions. Furthermore, the only support for the package is by means of metal-to-metal bonds formed by conductive columns or vias which interconnect the conductors on the respective layers.

U.S. Pat. No. 3,471,631 discloses a method of forming a multi-layer printed circuit board consisting of a plurality of superimposed epoxy glass rigid boards which are laminated together to form the multilayer board. However, the interconnection levels or layers are formed sequentially on top of the preceding layer so that a layer cannot be tested for integrity until it is already a part of the package; in other words, if a layer is found to be defective, then the entire package must be discarded. Semiconductor chip-packaging is not involved, and flexible thin film substrates are not disclosed.

U.S. Pat. No. 3,868,724 discloses a semiconductor chip interconnecting structure in the form of a Du Pont Kapton polyimide film carrying electrical conductors which project through openings in the film and are then bonded to metal contacts on an integrated circuit chip. Furthermore, only a single layer of film is disclosed.

SUMMARY OF THE INVENTION

The present invention is an improved process for fabricating a multi-level electrical interconnection structure for forming a package or module to which is attached a semiconductor integrated circuit chip or a plurality of such chips. Each decal-like layer of the final multi-layer structure is individually fabricated on a temporary (removable) substrate, tested for integrity, and, then, transferred to the module substrate or another layer. Each layer comprises a very thin polymer film which is not self supporting and which has on one surface thereof a metallized pattern of conductors which are selectively interconnected to the opposite surface by means of bonding metallurgy-filled vias or openings in the film. The opposite surface of the film is completely coated with an heat-activatable polymeric adhesive which, after activation, is stable at high temperatures; the adhesive is then removed in the small via hole areas to expose the bonding metallurgy. Each individual layer is used as a building block in forming the desired number of layers in the multi-layer structure. When the desired number of layers is assembled and the corresponding bonding metallurgy pads on adjacent layers are properly aligned, the package is subjected to heat and compression for simultaneously forming the metal-to-metal bonds and the film-to-film and film-to-substrate bonds. Alternatively, the layers may be sequentially bonded as the package is assembled.

Even though the final multi-layer structure is, in effect, fabricated by the lamination of different individual layers or building blocks, the final structure takes the form of a somewhat thicker polymeric film having conductors embedded therein and/or disposed on the top surface thereof. In either case, the polymeric films, themselves, are directly bonded to each other and to the module's rigid substrate, thereby forming a much denser package than has been available with prior art fabricating processes for multi-layer printed circuit boards.

DETAILED DESCRIPTION OF THE PREFERRED EMBODIMENT OF THE INVENTION

Figure 1:
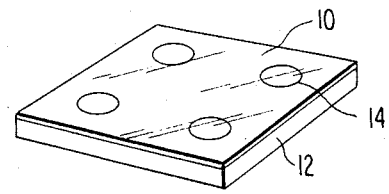
FIG. 1 is a view illustrating a thin polymeric film on a temporary substrate.

FIG. 1 shows a thin flexible polymeric film 10 the surface of a rigid thin removable ceramic (or metal) substrate 12, said substrate having four windows 14 formed therein and extending from the upper surface to its lower surface.

Figure 2:
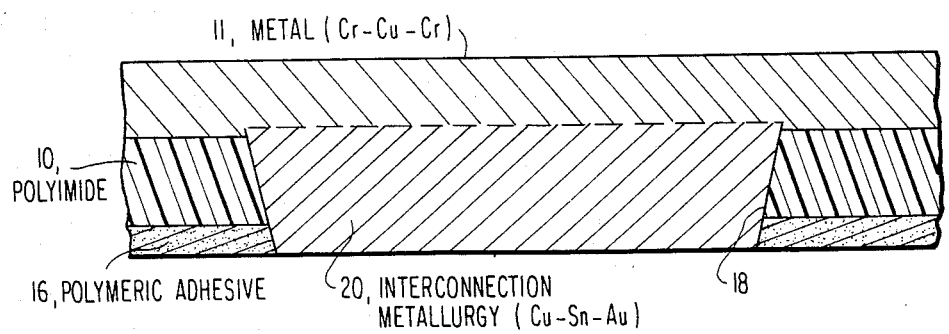
FIG. 2 is a partial cross-sectional view of a single building-block layer or structure from which a multi-layer interconnection structure can be fabricated.

FIG. 2 is a cross-section of a segment of a single buildingblock layer or level of this invention after the layer has been formed on film 10 in one of the windows 14.

The polymeric film is preferably a polyimide film known as Du Pont "Kapton", Type H. Other polyimide films made from Du Pont polyimides PI5878, PI2560, PI2566 and PI2550 may also be used. Typically, the film has a thickness of from one micron to ten mils. As shown in FIG. 2, metallized conductors 11, such as Cr—Cu—Cr, are formed on the top surface of the film 10 in one of the windows 14 while the film is still supported on the temporary substrate 12. The lower surface of the film 10 is coated in the window with an heat-activatable polymeric adhesive 16. Then, an opening or via 18 is made in the film by chemically milling or reactive ion etching and then filled with interconnection metallurgy 20 such as Cu/Sn/Au layers. Alternatively, the via 18 may be formed and filled with the metallurgy before the adhesive 16 is applied, in which case the adhesive covering the via areas is subsequently removed. There has thus been formed within each window a single building-block layer which may be bonded to a chip module substrate to form a chip module with a single layer interconnection structure thereon. Additional building-block layers may be superimposed one upon the other to form a multi-layer interconnection structure in the chip module. To transfer this decal-like layer to the module substrate, the layer is merely cut out of one of the windows 14 after the bonding or laminating process. The particular advantage of the present invention is that each building-block layer can be individually tested and inspected for integrity before it is transferred to the module substrate, thereby avoiding the problem of the prior art wherein the layers were formed in situ on the substrate and then tested; in such a prior art process, if the most recent layer failed inspection, then the entire multi-layer interconnection structure had to be discarded. In the present invention, if an individual layer fails inspection, then only that layer is discarded.

The high temperature stable, heat activatable polymeric resin is applied in liquid form and then partially cured to render it non-tacky. The partial curing is achieved, for example, by baking at 80° for one-half hour, then at 180° C. for one-half hour, and then at 270° C. for one-half hour, in order to drive off the solvent. This high-temperature adhesive is preferably that identified as LARC-2 fully disclosed in "High Temperature Adhesives for Bonding Polyimide Film", St. Clair et al, Adhesives Age, January 1979, pages 35–39, which is expressly incorporated herein by reference. Adhesives identified as LARC-3, LARC-4 and XU-218HD (marketed by Ciba Geigy Co.) are also acceptable.

To form a chip module with a single interconnection layer or structure, the layer of FIG. 2 is bonded under heat and pressure to a ceramic substrate having metal-filled vias. Typically, a heated platen is used to accomplish the bonding. The temperature is typically in the range of 300° C. to 400° C. and the pressure is typically in the range of 200 to 300 psi. When the bonding or lamination process is done under vacuum, the lower end of the pressure range will suffice. For a multi-layer interconnection structure, corresponding numbers of the building-block layer illustrated in FIG. 2 are superimposed upon each other and on the module substrate and simultaneously laminated and bonded to the substrate. The layered metals in the interconnection metallurgy in the vias are simultaneously alloyed to form the conductor-to-conductor bonds. The layers may alternatively first be bonded to each other and then bonded to the substrate.

Figure 3A:
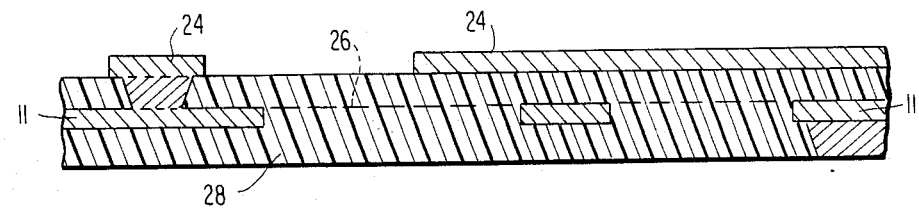
FIGS. 3A and 3B are partial cross-sectional views of two-level and three-level, respectively, interconnection structures fabricated by the improved process of this invention.

FIG. 3A illustrates in cross-section a two-layer interconnection structure consisting of the first layer of conductors 11 and a second layer of conductors 24 which are interconnected by the metallurgy in the vias. The boundary between the original individual layers is indicated by the dashed line 26, but, after lamination under heat and pressure the individual laminations, including the adhesive are converted into a single thicker film 28, whereby the final structure appears as a first level of conductors 11 embedded in the film 28 and a second level of conductors 24 on the top surface of the film 28.

Figure 3B:
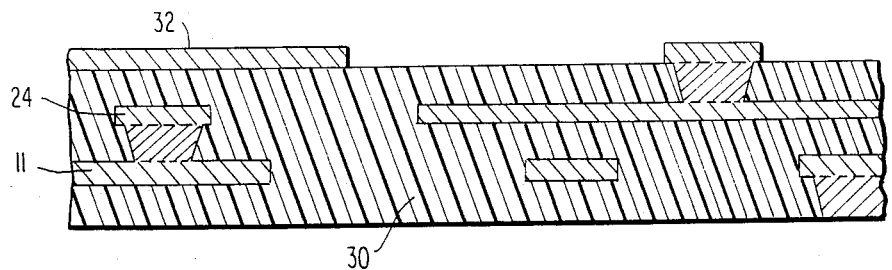

FIG. 3B is similar to FIG. 3A and shows a three-level interconnection structure in an even thicker film 30 and having a third level of conductors 32 on the top surface thereof.

Figure 4:
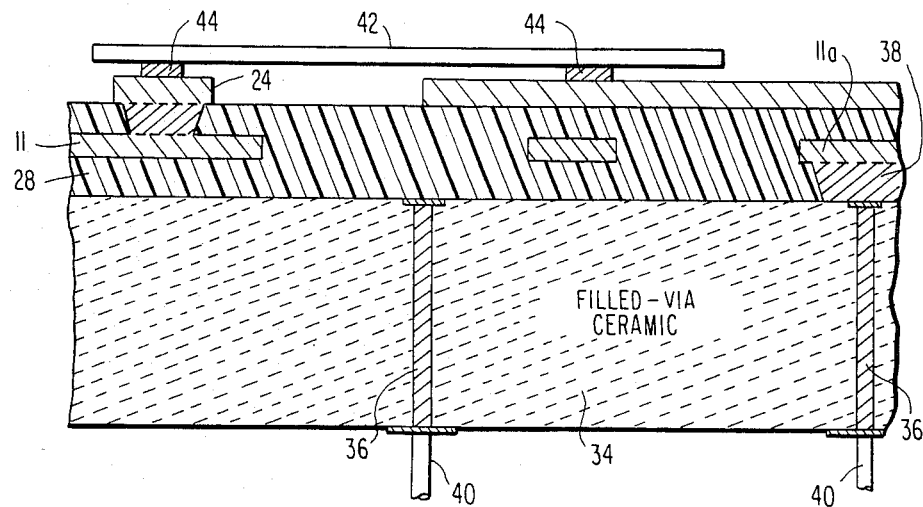
FIG. 4 is a cross-sectional view of a chip module in which a two-level interconnection structure has been bonded to a rigid ceramic substrate; a semiconductor integrated chip or plurality of such chips is also shown as being attached to the uppermost level of the interconnecting structure.

FIG. 4 shows the two-level structure of FIG. 3A bonded or laminated to the top surface of a thin film metal-capped filled-via ceramic substrate 34 of a chip module. The vias 36 of the substrate 34 are filled with metal, such as molybdenum or tungsten. The first level conductor 11a is shown electrically connected through the metallurgy 38 and a metal filled via 36 to an external pin lead 40. The top surface of the ceramic substrate 34 may also carry metallized conductor patterns, and the conductors in the interconnection structure may be used to interconnect various ones of the substrate conductors. Also shown in FIG. 4 is an integrated circuit chip 42 having metal contact pads 44 attached to the second level of conductors 24.

Figure 5:
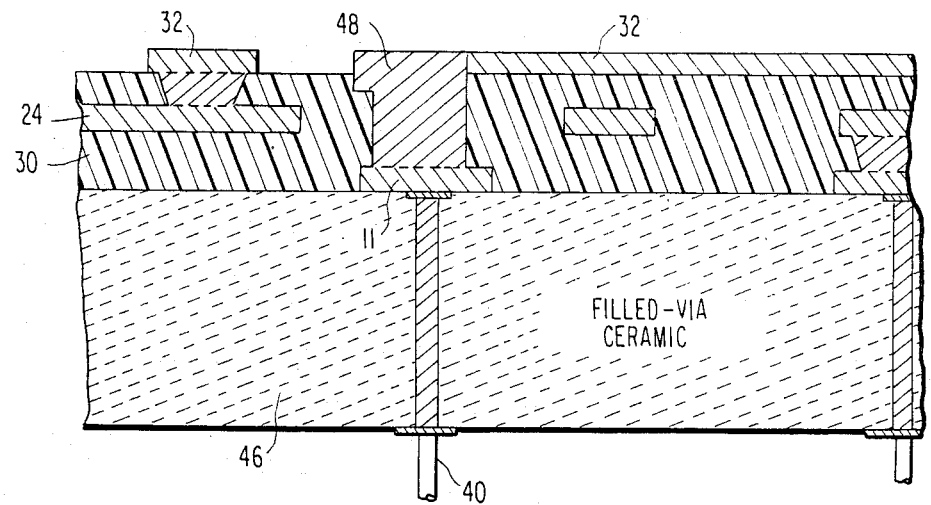
FIG. 5 is similar to FIG. 4 and shows a chip module in which a three-layer interconnection structure is bonded to a rigid ceramic substrate of a chip module.

FIG. 5 is similar to FIG. 4 without the chip 42. Here, a via stud 48 of interconnection metallurgy extends from one of the third level conductors 32 all the way through the film 30 to one of the first layer conductors 11 which is in contact with one of the filled ceramic vias 36 connected to an external pin lead 40.

Thus, by the process of this invention, an extremely dense chip interconnection structure can be fabricated wherein, in addition to metal-to-metal bonding, the polymeric film layers are also intimately laminated together in a single heat and compression step. Furthermore, since the individual building-block layers are formed on a temporary substrate and then tested and inspected before being transferred to the substrate of the chip module, higher yields are obtained as compared to prior art processes wherein the layers were formed in situ. When the lamination step is carried out under a vacuum, an extremely tight and air-free bond is obtained between the first layer and the module substrate. In this case, the module ceramic substrate is placed in a vacuum chamber formed by an O-ring placed between the first layer and a vacuum pump structure. The chamber is then evacuated to draw the layer into intimate contact with the top surface of the ceramic substrate at the same time that the heated platen is effecting the bond between the ceramic and the layer through the polyimide adhesive which forms the bond or lamination when subjected to heat at the temperature range specified above.

Having thus described our invention, what we claim as new, and desired to secure by Letters Patent is:

1. In a process of fabricating an electrical interconnection structure for an integrated circuit module, wherein the structure comprises at least one layer of an insulating film carrying conductors for interconnecting metal contact pads in the module or in a semiconductor device which may be attached to the module, the improvement comprising the steps of:
   a. temporarily supporting a first flexible thin polymer film on an upper surface of a first support member also having a lower surface and having at least one window therein extending between the upper and lower surfaces;
   b. forming a pattern of electrical conductors on the exposed upper surface of said film in an area thereof aligned with said window;
   c. coating, through said window, the opposite lower surface of said aligned area of said film with an adhesive;
   d. selectively forming vias in the aligned film area opposite some of said conductors; and
   e. placing metal-bonding electrically conducting metallurgy in the vias;
   so that, when the opposite lower surface of the film is placed in contact with an insulating substrate under heat and pressure, simultaneous bonds are formed through the vias between the conductors on the film and the contact pads on the substrate and between the film and the insulating substrate.

2. The improvement of claim 1, wherein said adhesive is an heat-activatably polymer, and further comprising repeating steps a, b, c, d, and e for a second said thin polymer film and a second said support member, and, then, placing the opposite surface of said first film in contact with the insulating substrate; placing the opposite surface of said second film in contact with the upper surface of said first film; and simultaneously forming metal-to-metal, film-to-film and film-to-substrate bonds by applying heat and pressure until the metallurgy and the adhesive form their respective bonds.

3. The improvement of claim 2 wherein the polymer films are cured polyimide and the adhesive is a partially cured aromatic polyimide.

4. The improvement of claim 2 wherein said step of simultaneously forming further comprises the step of applying a vacuum to place said first film into intimate contact with the insulating substrate.

5. The improvement of claim 1 wherein step c follows step e.

6. The improvement of claim 1, wherein said adhesive is an heat-activatable polymer, and further comprising repeating steps a, b, c, d and e for a second said thin polymer film and a second said support member, and, then, placing the opposite surface of said second film in contact with the upper surface of said first film; and simultaneously forming metal-to-metal, and film-to-film bonds by applying heat and pressure until the metallurgy and the adhesive form their respective bonds.

7. The improvement of claim 1, wherein said adhesive is an heat-activatable polymer, and further comprising the steps of:
   removing the thus-fabricated interconnection structure from said support member; and
   placing said opposite surface of said film in contact with the insulating substrate, and simultaneously forming metal-to-metal and film-to-substrate bonds by applying heat and pressure until the metallurgy and the adhesive form their respective bonds.

8. The improvement of claim 1 further comprising the steps of testing the thus-fabricated said interconnection structure for integrity and, then, removing said structure from the support.

9. The improvement of claim 5 further comprising the step of, then, removing the adhesive coated on the metallurgy in the vias.

10. The improvement of claim 9, wherein said adhesive is an heat-activatable polymer, and further comprising the steps of:
   removing the thus-fabricated interconnection structure from said support member; and
   placing said opposite surface of said film in contact with the insulating substrate, and simultaneously forming metal-to-metal and film-to-substrate bonds by applying heat and pressure until the metallurgy and the adhesive form their respective bonds.

* * * * *